(12) United States Patent
Bao (10) Patent No.: US 9,099,558 B2
(45) Date of Patent: Aug. 4, 2015

(54) FIN FET STRUCTURE WITH DUAL-STRESS SPACERS AND METHOD FOR FORMING THE SAME

(71) Applicant: Wayne Bao, Shanghai (CN)

(72) Inventor: Wayne Bao, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 175 days.

(21) Appl. No.: 13/653,329

(22) Filed: Oct. 16, 2012

(65) Prior Publication Data

US 2013/0168748 A1 Jul. 4, 2013

(30) Foreign Application Priority Data

Dec. 29, 2011 (CN) .......................... 2011 1 0453483

(51) Int. Cl.
| | |
|---|---|
| H01L 29/78 | (2006.01) |
| H01L 21/20 | (2006.01) |
| H01L 21/8238 | (2006.01) |
| H01L 21/84 | (2006.01) |
| H01L 27/092 | (2006.01) |
| H01L 27/12 | (2006.01) |
| H01L 29/66 | (2006.01) |

(52) U.S. Cl.
CPC .... *H01L 29/7843* (2013.01); *H01L 21/823807* (2013.01); *H01L 21/823821* (2013.01); *H01L 21/845* (2013.01); *H01L 27/0924* (2013.01); *H01L 27/1211* (2013.01); *H01L 29/66795* (2013.01); *H01L 29/785* (2013.01)

(58) Field of Classification Search
CPC ................................ H01L 29/78; H01L 21/20
USPC .............. 257/288, E29.255, E21.09; 438/478
See application file for complete search history.

(56) References Cited

U.S. PATENT DOCUMENTS

| | | | |
|---|---|---|---|
| 7,868,380 B2 | 1/2011 | Kim et al. | |
| 2004/0036127 A1* | 2/2004 | Chau et al. ................... | 257/401 |
| 2005/0173768 A1* | 8/2005 | Lee et al. ...................... | 257/401 |
| 2006/0022268 A1* | 2/2006 | Oh et al. ....................... | 257/347 |
| 2008/0050868 A1* | 2/2008 | Lee et al. ...................... | 438/199 |
| 2008/0265321 A1* | 10/2008 | Yu et al. ........................ | 257/344 |
| 2009/0095980 A1* | 4/2009 | Yu et al. ........................ | 257/190 |
| 2009/0280626 A1* | 11/2009 | Zhu et al. ..................... | 438/479 |
| 2011/0193178 A1* | 8/2011 | Chang et al. .................. | 257/408 |
| 2011/0212601 A1* | 9/2011 | Moroz et al. .................. | 438/478 |
| 2011/0306198 A1* | 12/2011 | Jeong et al. ................... | 438/595 |

FOREIGN PATENT DOCUMENTS

| | | |
|---|---|---|
| CN | 1695227 A | 11/2005 |
| CN | 1976059 A | 6/2007 |

\* cited by examiner

*Primary Examiner* — Kevin Parendo
*Assistant Examiner* — Lamont Koo
(74) *Attorney, Agent, or Firm* — Anova Law Group, PLLC (57) ABSTRACT

This application discloses a Fin FET structure and a method for forming the same. In the Fin FET structure, there are lower stress spacers disposed over the lower portion of the fin's opposite sidewalls, asserting one stress type to suppress the carrier mobility; there are also upper stress spacers disposed over the upper portion of the fin's opposite sidewalls, asserting an opposite stress type to increase the carrier mobility. Therefore, the leakage current in the fin FET is reduced and the device performance is improved. In the method, the stress spacers are formed by depositing stress layers and etching back the stress layers, where stress types and magnitudes are controllable, resulting in a simple process.

11 Claims, 13 Drawing Sheets

FIN FET STRUCTURE WITH DUAL-STRESS SPACERS AND METHOD FOR FORMING THE SAME

CROSS-REFERENCES TO RELATED APPLICATIONS

The present application claims priority to Chinese patent application No. CN201110453483.7, filed on Dec. 29, 2011, and titled "SEMICONDUCTOR STRUCTURE AND METHOD FOR FORMING THE SAME, CMOS DEVICE AND METHOD FOR FORMING THE SAME", the entire contents of which are incorporated herein by reference.

FIELD OF THE INVENTION

The present disclosure generally relates to the field of Fin FET semiconductor manufacturing and, more particularly, to a Fin FET with stress spacers and a method for forming the same.

BACKGROUND

With continuous development of semiconductor technology and the process nodes scaling, the metal gate-last technique has been adopted in front end gate process to achieve desired threshold voltages and to improve device performance. However, as device's critical dimension further shrinks, a conventional MOS field effect transistor (MOSFET), even formed with the gate-last techniques, will not meet the device's requirements for the performance. A fin field effect transistor (Fin FET), a new type of FET device, has gained broad attention as a substitute to the conventional MOSFET.

With conventional techniques, a common type of Fin FET's fin is formed by etching portions of the substrate. When the Fin FET formed by such method is in operation, besides the desired electron migration in the fin's upper portion, electrons also moves between the fin and the substrate, resulting in large leakage current.

To reduce the leakage current, a silicon-on-insulation (SOI) substrate is introduced to form a Fin FET. However, a fin FET on an SOI has certain disadvantages. First, undesired electrons continue to migrate in the lower portion of the fin even on an SOI substrate, therefore the leakage current remains high. Second, an SOI substrate is expensive.

Therefore, there is a need to provide a low-leakage-current Fin FET device.

SUMMARY

One embodiment of the present disclosure provides a Fin FET structure with dual-stress spacers. The Fin FET structure includes a substrate, a fin formed over the substrate and an isolating layer formed around the fin and over the top surface of the substrate. A plurality of stress spacers are formed on the fin's opposite sidewalls, including first type stress spacers formed on the lower portion of the sidewalls and second type stress spacers formed over the first type stress spacers and on the upper portion of the sidewalls. Lower stress spacers assert a first stress type and upper stress spacers assert a second stress type respectively. The first stress type is opposite to the second stress type.

For example, if the fin is n-type doped, the carriers disposed therein are electrons, the lower stress spacers assert compressive stress and the upper stress spacers assert tensile stress. In contrast, if the fin is p-type doped, the carriers disposed therein are holes, correspondingly, the lower stress spacers assert tensile stress and the upper stress spacers assert compressive stress.

In the Fin FET structure provided by the embodiment, the carriers' migration is increased in the fin's upper portion and suppressed in the fin's lower portion, resulting in improved device performance and reduced leakage current.

The embodiment of the present disclosure further provides a method for forming the Fin FET structure. In the method, steps for forming dual-stress spacers on the fin's opposite sidewalls are included. A plurality of lower stress spacers are formed on the sidewalls' lower portion and a plurality of upper stress spacers are formed over the lower stress spacers and the sidewalls' upper portion. The lower stress spacers and the upper stress spacers assert opposite stress types.

In this way, the fin's upper portion and lower portion may be respectively affected by opposite stress types, increasing the carriers' mobility in the upper portion and suppressing it in the lower portion according to the fin's doping types. The heights, stress types and stress magnitudes of the stress spacers are controllable by tweaking the process parameters in the steps for forming the stress spacers, resulting in a robust process.

The embodiment of the present disclosure further provides a method for forming a Fin FET CMOS structure. In the method, stress layers for forming lower stress spacers for an n-type fin and a p-type fin are formed to be the same in material and thickness, similarly, stress layers for forming upper stress spacers are also formed to be the same in material and thickness. Therefore, forming the lower stress spacers and the upper stress spacers can be respectively achieved by one etching process, resulting in a simple process.

DETAILED DESCRIPTION

The following detailed description of the disclosure refers to the accompanying drawings. The same reference numbers may be used in different drawings to identify the same or similar elements. Also, the following detailed description does not limit the disclosure.

Disclosed herein are process steps for forming a Fin FET structure. It should be noted, however, the process steps described herein for forming the spacers of the Fin FET structure are equally applicable to a number of fin-based, multi-gate transistor architecture regardless of the number of gates. Moreover, the present disclosure may be practiced in conjunction with a variety of conventional integrated circuit techniques, and certain commonly practiced process steps are included herein to provide an understanding of the present disclosure and/or to be combined with other process steps.

Figure 1:
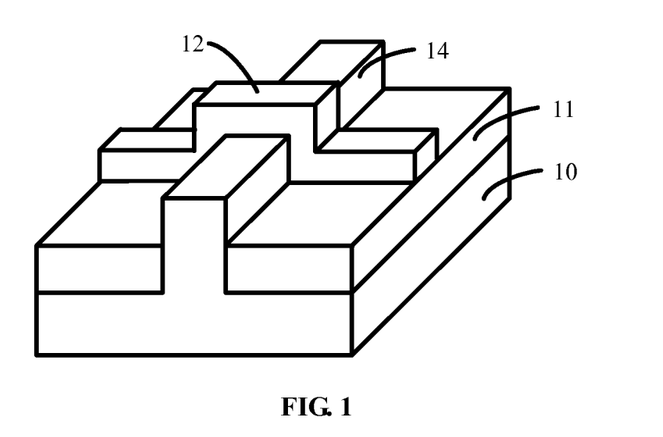
FIG. 1 is a three-dimensional view of a type of common Fin FET.

FIG. 1 is a three-dimensional view of a common type Fin FET. As shown in FIG. 1, the Fin FET includes a substrate 10 and a fin 14 protruding from substrate 10. A dielectric layer 11 is disposed to cover substrate 10 on both sides of fin 14. A gate structure 12, including a gate dielectric layer and a gate electrode layer (not shown in FIG. 1), is disposed on dielectric layer 11. Gate structure 12 stretches over fin 14, partially covering the top surface and sidewalls of fin 14. A source region and a drain region are respectively disposed within fin 14 on opposite sides of gate structure 12.

Figure 2:
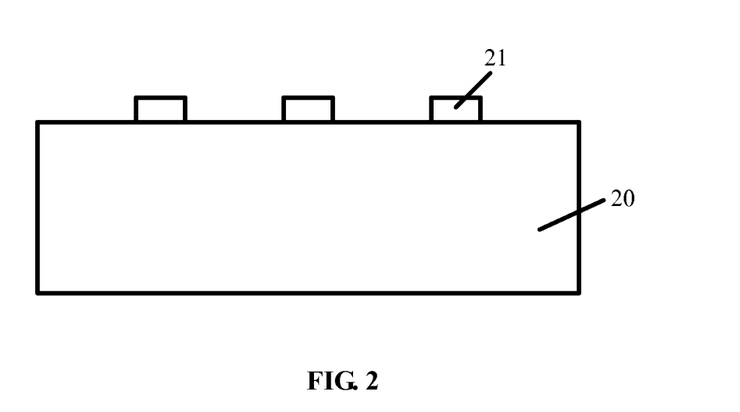
FIGS. 2 and 3 are cross-sectional views of intermediate structures of the common Fin FET in FIG. 1.
Figure 3:
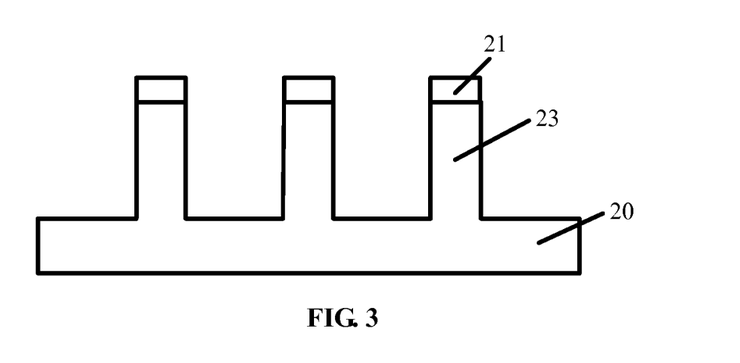

FIGS. 2 and 3 are cross-sectional views of intermediate structures of the common type Fin FET in FIG. 1. Referring to FIG. 2, the formation process includes: providing a substrate 20, and forming a patterned photoresist layer 21 on the substrate 20. Referring to FIG. 3, the formation process further includes: etching the substrate 20 using the patterned photoresist layer 21 as a mask to form a fin 23 which protrudes from the substrate 20. Multiple fins may be formed.

Figure 4:
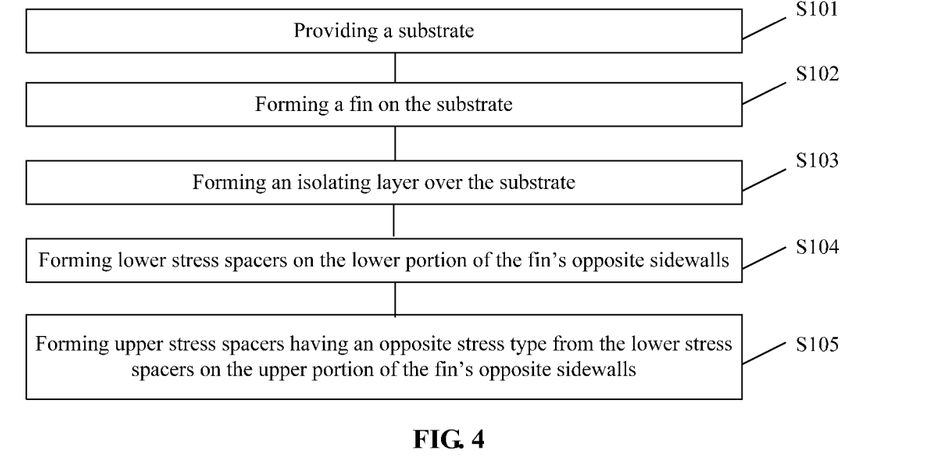
FIG. 4 is a flow chart of a method for forming a Fin FET structure according to the present disclosure.

An exemplary method is provided hereinafter for forming a Fin FET structure. Referring to FIG. 4, the method includes: step S101, providing a substrate; step S102, forming a fin on the substrate; step S103, forming an isolating layer over the substrate; step S104, forming lower stress spacers on the lower portion of the fin's opposite sidewalls; and step S105, forming upper stress spacers having an opposite stress type from the lower stress spacers on the upper portion of the fin's opposite sidewalls.

It should be noted that, in the following detailed descriptions, the terms "upper", "lower", "height", etc., are used with reference to the orientation of the Figures being described. Because components can be positioned in a number of different orientations, terms are used for purposes of illustration and are not limiting.

FIGS. 5-11 are cross-sectional views illustrating the process steps in forming the fin FET structure according to the above method.

Figure 5:
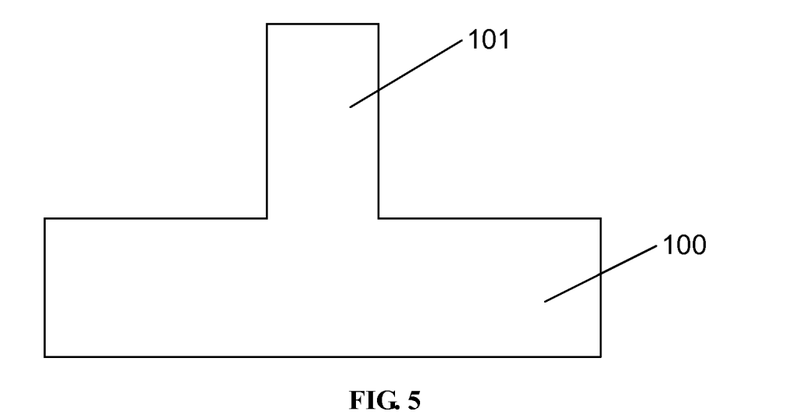
FIGS. 5-11 are cross-sectional views of intermediate structures illustrating the process for forming a Fin FET structure according to embodiments of the present disclosure.

Referring to FIG. 5, a substrate 100 is provided and a fin 101 is formed.

Substrate 100 may be a mono-crystalline. Materials of substrate 100 may include silicon, germanium, gallium arsenide compound, or silicon germanium compound. Substrate 100 may include an epitaxial layer. Substrate 100 may be an SOI. Substrate 100 may be other semiconductor substrates which are not enumerated herein in detail.

Fin 101 is formed on substrate 100. Subsequent steps are performed on the substrate 100 with fin 101 formed thereon to form a Fin FET.

It should be noted that fin 101 and substrate 100 may have different structures with different types of original substrates. For example, if the original substrate is bulk silicon, fin 101 (which is formed by removing portions of the original substrate) and substrate 100 (which is the remaining part of the original substrate) are electrically connected.

Figure 6:
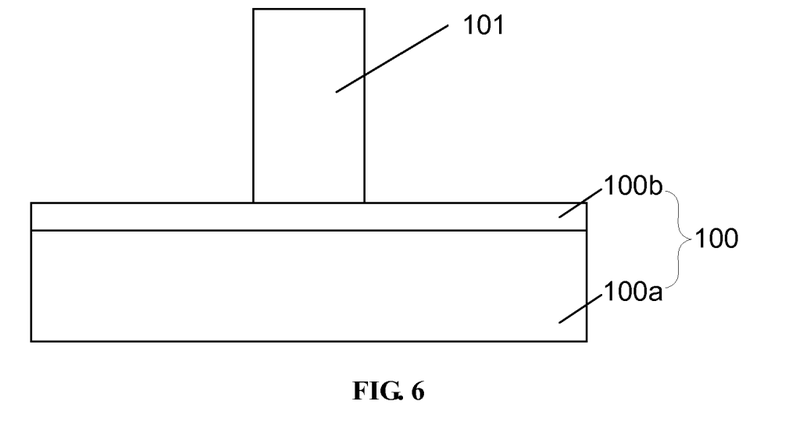

For another example, as shown in FIG. 6, the original substrate is an SOI (silicon on insulator) substrate which includes bottom silicon 100a, an insulating layer 100b and top silicon layer. Fin 101 is formed by etching portions of the top silicon and it is electrically isolated from substrate 100 which includes bottom silicon 100a and insulating layer 100b.

The following descriptions illustrate the example of a fin made in a bulk silicon substrate.

Figure 7:
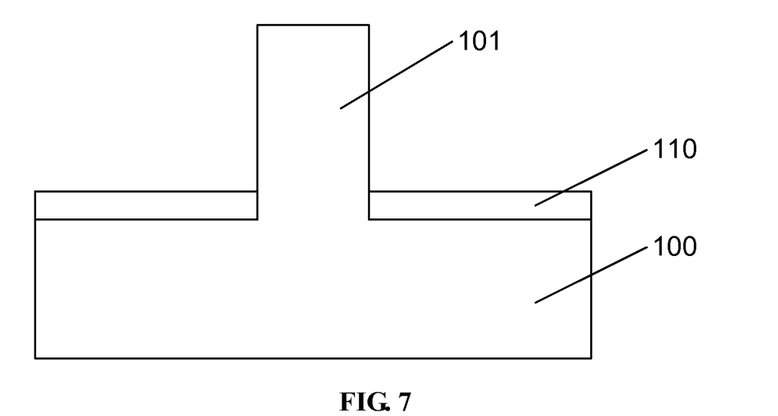

Referring to FIG. 7, an isolating layer 110 is formed over substrate 100. In subsequent process steps, stress spacers and a gate structure are formed over fin 101, isolating layer 110 electrically isolates these structures from substrate 100. Isolating layer 110 may be silicon oxide. If fin 101 is formed on an SOI, formation of isolating layer 110 can be omitted.

Figure 8:
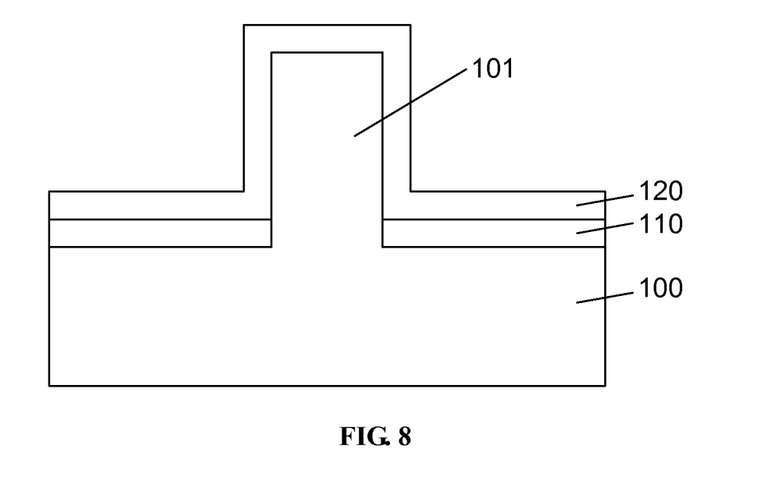

Referring to FIG. 8, a first stress layer 120 is formed on isolating layer 110 and covering fin 101. The first stress layer 120 has one stress type, either tensile or compressive. The first stress layer 120 may be formed by depositing silicon nitride, silicon-oxy-nitride, or other ceramic materials.

The stress type and magnitude of the first stress layer 120 are controllable by varying the stress layer deposition parameters. For example, if a silicon nitride layer is deposited and a tensile stress is desired, the deposition parameters may include: temperature in the range of 300° C. to 500° C., gas pressure in the range of 1 torr to 10 torr, source high frequency RF power in the range of 50 W to 300 W, $SiH_4$ flow rate in the range of 20 sccm to 200 sccm, $NH_3$ flow rate in the range of 200 sccm to 1500 sccm, and $N_2$ flow rate in the range of 500 sccm to 5000 sccm. First stress layer 120 fabricated with the above method has a tensile stress ranging from about 0.8 GPa to about 2.0 GPa.

In another example, if a compressive stress is desired, the deposition parameters may include: temperature in the range of 400° C. to 550° C., gas pressure in the range of 1 torr to 10 torr, plasma high frequency RF power in the range of 50 W to 200 W, low frequency RF power in the range of 10 W to 100 W, $SiH_4$ flow rate in the range of 20 sccm to 200 sccm, $NH_3$ flow rate in the range of 50 sccm to 500 sccm and Ar flow rate in the range of 1000 sccm to 5000 sccm. First stress layer 120 fabricated with the above method has a compressive stress ranging from about 1.0 GPa to about 4.0 GPa.

The first stress layer 120 is used to form lower stress spacers in subsequent steps, to suppress carrier mobility in lower portion of fin 101 and to reduce the leakage current formed therein. Therefore, if fin 101 is in an NMOS device, the first stress layer 120 asserts compressive stress. If fin 101 is in a PMOS device, the first stress layer 120 asserts tensile stress.

Figure 9:
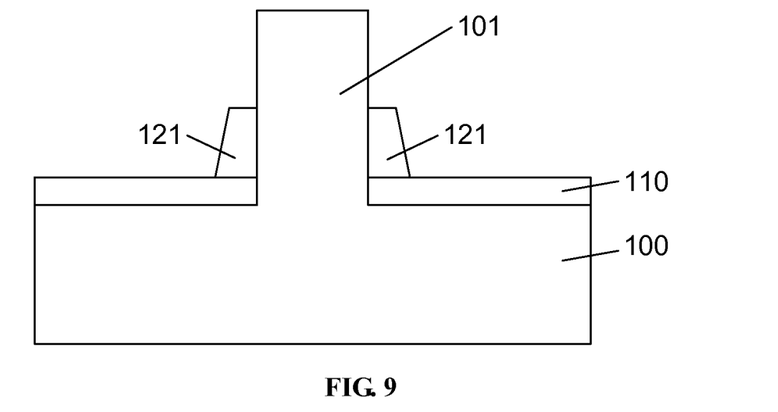

Referring to FIG. 9, a couple of lower stress spacers 121 are formed on both sidewalls of the lower portion of fin 101 after removing part of the first stress layer 120 in FIG. 8. An etch-back process may be applied here to form the lower stress spacers 121.

The process of etching back the first stress layer 120 in FIG. 9 may be a plasma etching process and is not described in detail here.

Lower stress spacers 121 are formed on the lower portion of fin 101's opposite sidewalls to suppress the carriers' mobility therein. The height of lower stress spacers 121 ranges from about ⅓ to about ½ of fin 101's height. Typically the low stress layer ranges from 50 nm to 200 nm. Within this range, the stress provided by lower stress spacers 121 may sufficiently reduce the leakage current without affecting the channel near fin 101's upper portion.

It should be noted that, lower stress spacers 121's height is controllable by adjusting parameters of the etch-back process. The heights disclosed above are merely examples and should not unduly limit the scope of the present disclosure.

Figure 10:
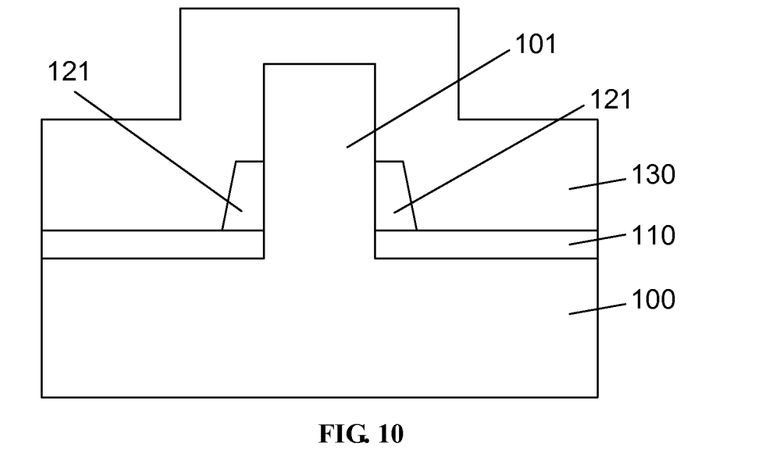

Referring to FIG. 10, a second stress layer 130 is formed on isolating layer 110, covering fin 101 and lower stress spacers 121. The second stress layer 130 has a stress type opposite from that of the first stress layer 120.

The second stress layer 130 may be silicon nitride, silicon-oxy-nitride, or other ceramic materials and may be formed by a deposition process. The stress type and magnitude thereof are controllable by adjusting the deposition parameters. Formation of the second stress layer 130 can be referenced from the descriptions of forming the first stress layer 120 above.

Figure 11:
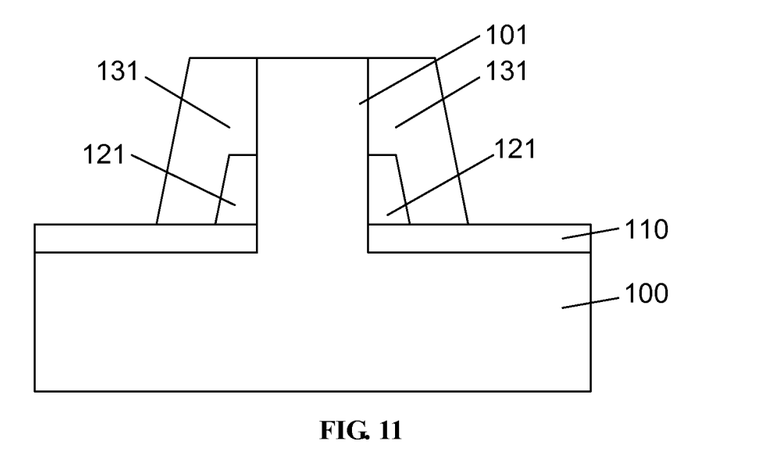

Referring to FIG. 11, a plurality of upper stress spacers 131 are formed on upper portions fin 101's opposite sidewalls by etching back the second stress layer 130 in FIG. 10. The process of etching back second stress layer 130 in FIG. 10 may include plasma etching process, which will not be described in detail here.

Upper stress spacers 131 cover the upper portions of fin 101's opposite sidewalls and assert stress opposite to lower stress spacers 121's stress to increase carrier mobility in fin 101's upper portion, resulting in improved device performance.

Upper stress spacers 131 also cover lower stress spacers 121 and, therefore, stresses with opposite types are jointly asserted to the lower portion of fin 101. Nevertheless, lower stress spacers 121 are closer to fin 101's lower portion, asserting stress which has more effects to that portion. So the net stress asserted to fin 101's lower portion is still to suppress the carriers' mobility.

Similar to lower stress spacers 121, upper stress spacers 131's height is also controllable by adjusting parameters of the etch-back process. Upper stress spacers 131's height may equal to fin 101's height to improve the carriers' mobility. For example, upper stress spacers 131's height ranges from about 200 nm to about 500 nm.

It should be noted that, height of the lower or the upper stress spacers equals to the distance from the stress spacers' top surface to the isolating layer 110's top surface, or to the substrate 100's top surface if the isolating layer is not on the substrate (which means fin 101 is formed on an SOI). Fin 101's height equals to the distance from the fin 101's top surface to the isolating layer 110's top surface, or to the substrate 100's top surface if the isolating layer 110 is not on the substrate.

Figure 12:
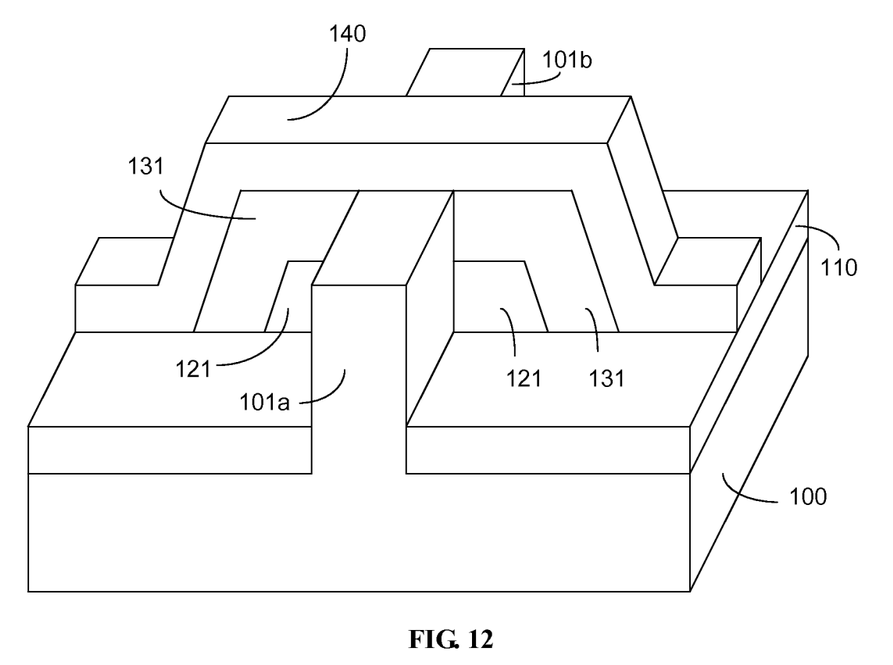
FIG. 12 is a three-dimensional view of a Fin FET structure according to embodiments of the present disclosure.

In subsequent processes, a gate structure, a source region and a drain region are formed. Referring to FIG. 12, a gate structure 140 is formed to stretch over fin 101, covering portions of fin 101's top surface and the stress spacers. The gate structure may include a gate dielectric layer (not shown) and a gate electrode (not shown) formed on the gate dielectric layer. Furthermore, a source region 101a and a drain region 101b are formed in the fin 101 on opposite sides of the gate structure.

Thus, a Fin FET with dual-stress spacers is formed. The dual-stress spacers include lower stress spacers 121 and upper stress spacers 131. In fin 101's lower portion, the net stress jointly asserted by lower stress spacers 121 and upper stress spacers 131's lower portions suppresses the carriers' mobility, reducing the leakage current. In fin 101's upper portion, the stress asserted by upper stress spacers 131 increases the carriers' mobility, improving the device's performance. The height, stress type and stress magnitude of the stress spacers are controllable by tweaking the deposition process steps and the etching-back process steps, allowing for a simple process.

Figure 13:
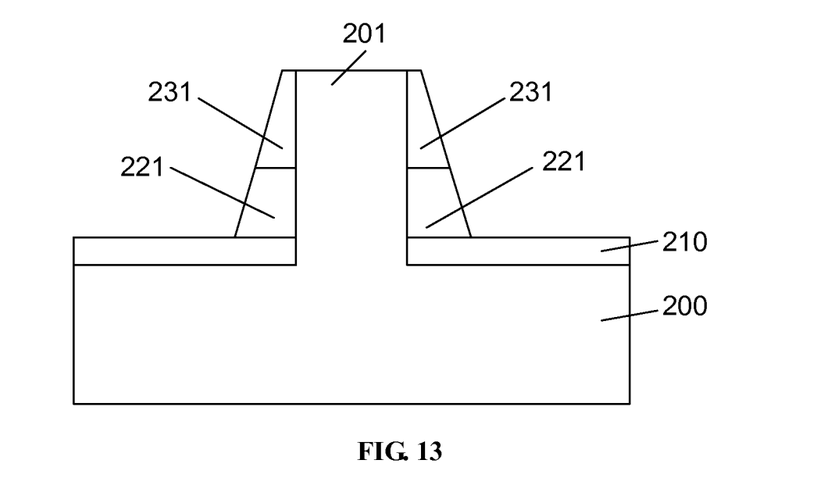
FIGS. 13-14 are cross-sectional views of two other exemplary Fin FET structures according to the present disclosure.

The present disclosure further provides another Fin FET structure. Referring to FIG. 13, the Fin FET structure includes a substrate 200 and a fin 201 formed on substrate 200. An isolating layer 210 is disposed over substrate 200's top surface and around fin 201. The Fin FET structure further includes a couple of lower stress spacers 221 disposed on the lower portion of fin 201's opposite sidewalls and a couple of upper stress spacers 231 disposed on the upper portion of fin 201's opposite sidewalls. Upper stress spacers 231 assert a stress type opposite to that lower stress spacers 221 assert.

It should be noted that, whether the upper and lower spacers are in contact, or whether the lower spacers and the isolating layer are in contact, should not limit the scope of the present disclosure. FIG. 13 only shows an exemplary structure.

Figure 14:
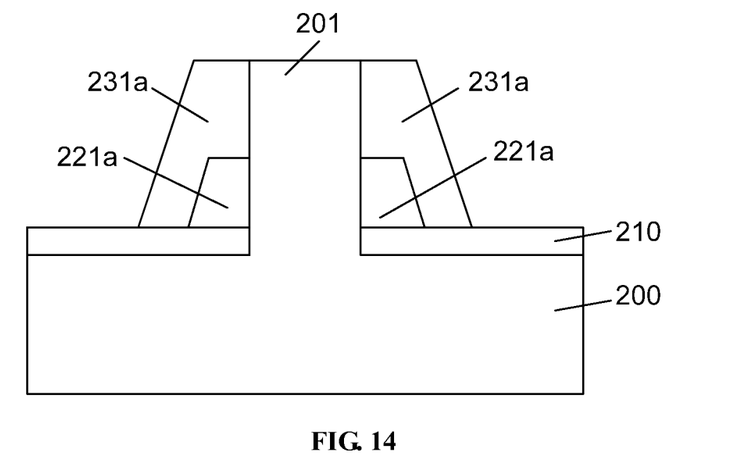

In another exemplary structure, as shown in FIG. 14, upper stress spacers 231a may include portions disposed over lower stress spacers 221a.

Specifically, substrate 200 may be a mono-crystalline. Materials of substrate 100 may include silicon, germanium, gallium arsenide compound, or silicon germanium compound. Substrate 200 may include an epitaxial layer. Substrate 200 may be an SOI or any of other semiconductor substrates which are not enumerated herein in detail.

Fin 201 forms a base for an n-type Fin FET or p-type Fin FET and the stress type of the stress spacers are chosen accordingly. For example, if fin 201 is n-type doped, lower stress spacers 221 assert a compressive stress. Specifically, the compressive stress ranges from about 1.0 GPa to about 4.0 GPa; and upper stress spacers 231 assert a tensile stress, which ranges from about 0.8 GPa to about 2.0 GPa. If fin 201 is p-type doped, lower stress spacers 221 assert a tensile stress ranging from about 0.8 GPa to about 2.0 GPa, and upper stress spacers 231 assert a compressive stress ranging from about 1.0 GPa to about 4.0 GPa. By choosing the stress magnitude within the above ranges, a significant improvement of the device performance may be achieved together with a great decrease of the leakage current, without introducing unacceptable interference.

The height of lower stress spacers 221 ranges preferably from about ⅓ to about ½ of the height of fin 201. Within this range, a sufficient stress effect can be applied to fin 201's lower portion to suppress the carriers' mobility without undesirably affecting the channel region near fin 201's upper portion. The height of upper stress spacers 231 preferably may equal to fin 201's height to increase the carriers' mobility in fin 201's upper portion sufficiently. As an example, lower stress spacers 221's height ranges from about 50 nm to about 200 nm, upper stress spacers 231's height ranges from about 200 nm to 500 nm.

An exemplary method for forming a Fin FET CMOS device is also provided. The method is illustrated in detail with reference to cross-sectional views of intermediate structures in a process for forming the Fin FET CMOS device.

Figure 15:
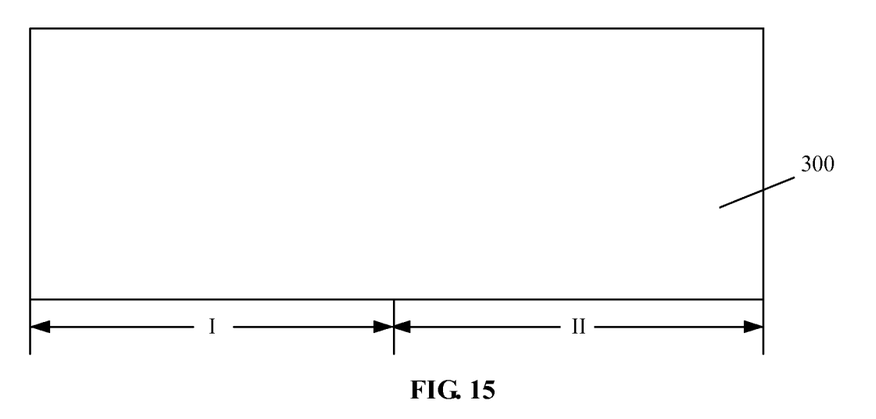
FIGS. 15-28 are cross-sectional views of intermediate structures in the disclosed process for forming a Fin FET CMOS structure according to another embodiment of the present disclosure.

Referring to FIG. 15, a substrate 300 including a first region I and a second region II is provided. Substrate 300 may be a mono-crystalline. Material of substrate 300 may be silicon, germanium, gallium arsenide compound, or silicon germanium compound. Substrate 300 may be an SOI or may include an epitaxial layer. Substrate 300 may be other semiconductor materials which are not numerated in detail herein.

Figure 16:
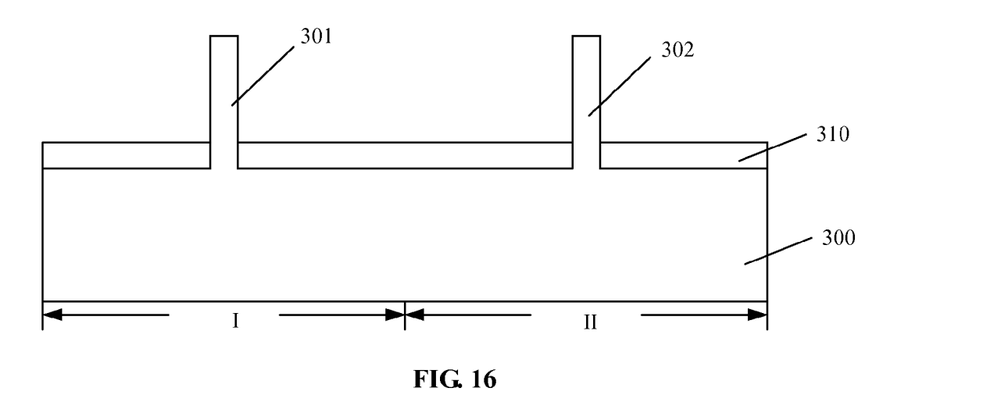

Referring to FIG. 16, a first fin 301 and a second fin 302 are formed respectively on the first region and the second region, and an isolating layer 310 is formed around the fins, covering substrate 300's top surface.

In a CMOS device, an n-type MOS device and a p-type MOS device coexist. The following description illustrates the method for forming a Fin FET CMOS device as the first fin 301 forming a base for an n-type Fin FET and the second fin 302 forming a base for a p-type Fin FET.

As described above, isolating layer 310 is required to be formed to isolate structures formed subsequently from substrate 300. However, if substrate 300 is originally an SOI, formation of isolating layer 310 may be omitted, since the insulating layer of the SOI can perform the functionality of isolating.

Figure 17:
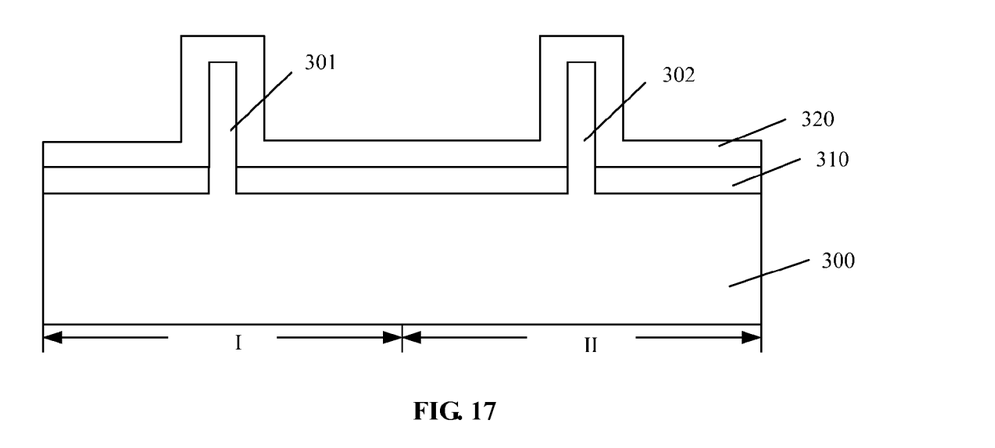

Referring to FIG. 17, a first stress layer 320 is formed over the first fin 301 and the second fin 302. The first stress layer 320 is used to form lower stress spacers to suppress the carrier mobility in the first fin 301's lower portion. Because the first fin 301 is n-type, the first stress layer 320 assert compressive stress.

The first stress layer 320 may be silicon nitride, silicon-oxy-nitride, or other ceramic materials and may be formed by a deposition process, the stress type and magnitude of which are controllable, as described above.

Figure 18:
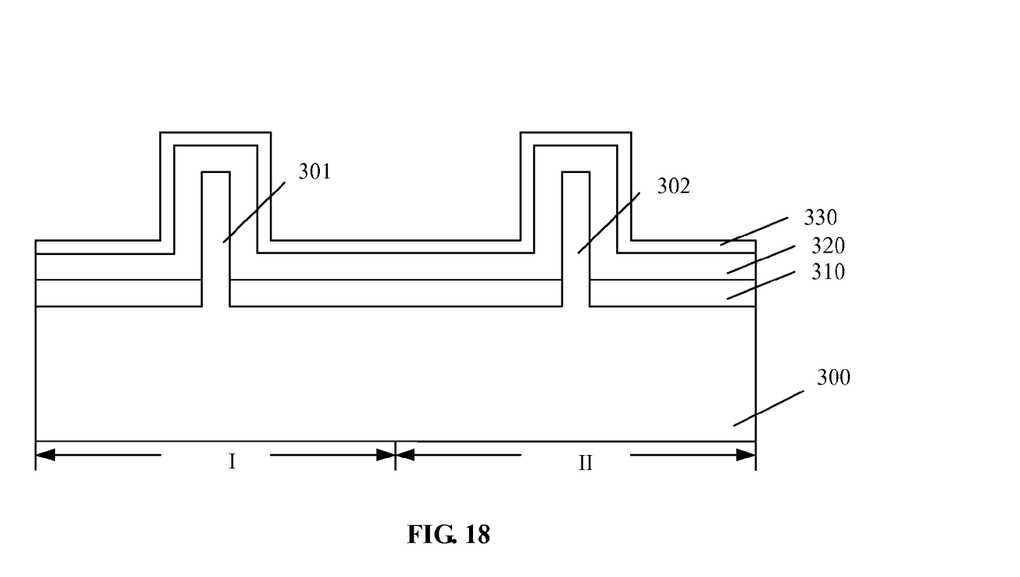

Referring to FIG. 18, a first etching stop layer 330 is formed on the first stress layer 320. The first etching stop layer 330 is used to protect the first stress layer 320 from being damaged by the over etch process during a subsequent etching process. The first etching stop layer 330 may be silicon oxide.

Figure 19:
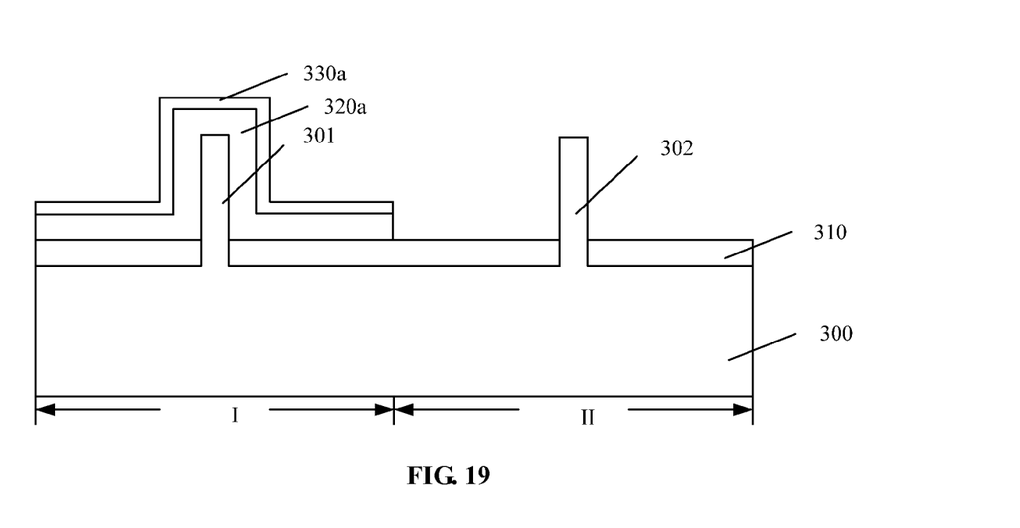

Referring to FIG. 19, the first stress layer 320 (shown in FIG. 18) and the first etching stop layer 330 (shown in FIG. 18) are partially removed, a remaining first stress layer 320a and a remaining first etching stop layer 330a within the first region I are formed.

Specifically, a photoresist layer is formed within the first region I on the first etching stop layer 330 (shown in FIG. 18), and a wet etching or dry etching process is performed using the photoresist layer as a mask. Thereafter, the photoresist layer is removed.

Figure 20:
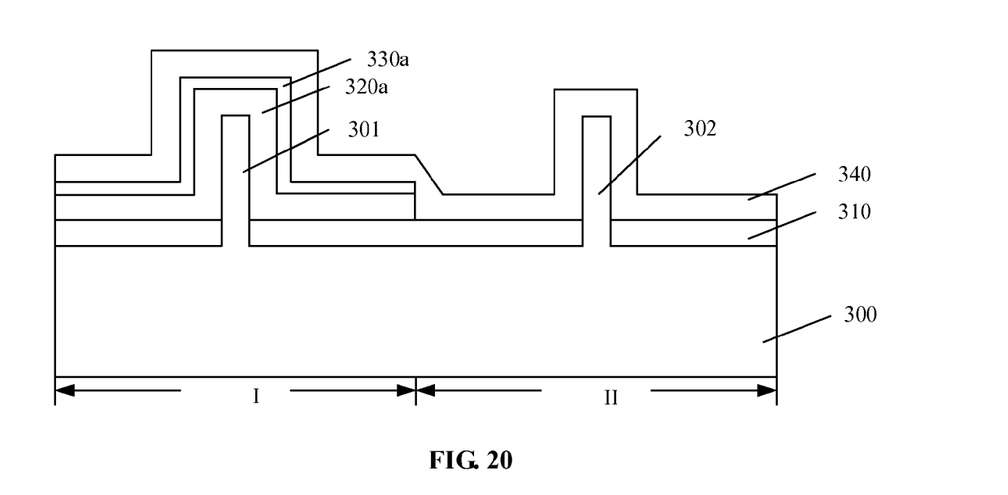

Referring to FIG. 20, a second stress layer 340 is formed, covering the second fin 302 and the remaining first etching stop layer 330a. The second stress layer 340 is used to form lower stress spacers in subsequent steps to reduce the carrier mobility in the second fin 302's lower portion.

The second stress layer 340 may be silicon nitride, silicon-oxy-nitride, or other ceramic materials and may be formed by a deposition process. As an example, the second fin 302 is p-type, so the second stress layer 340 asserts tensile stress to reduce leakage current.

Figure 21:
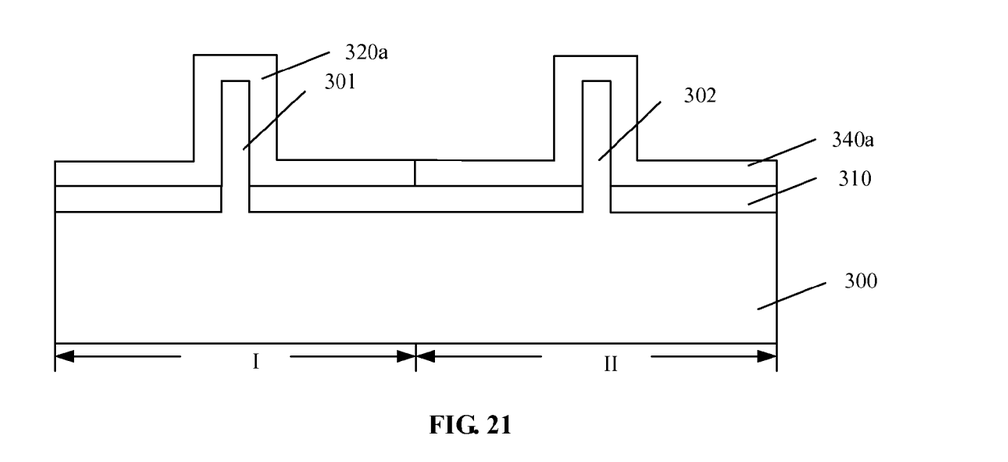

Referring to FIG. 21, a portion of the second stress layer 340 (shown in FIG. 20) in the first region I and the remaining first etching stop layer 330a (shown in FIG. 20) are removed by wet etching or dry etching. Therefore, the remaining first stress layer 320a and the remaining second stress layer 340a are respectively disposed only in the first region I and the second region II. This step may be achieved by a lithography process.

Figure 22:
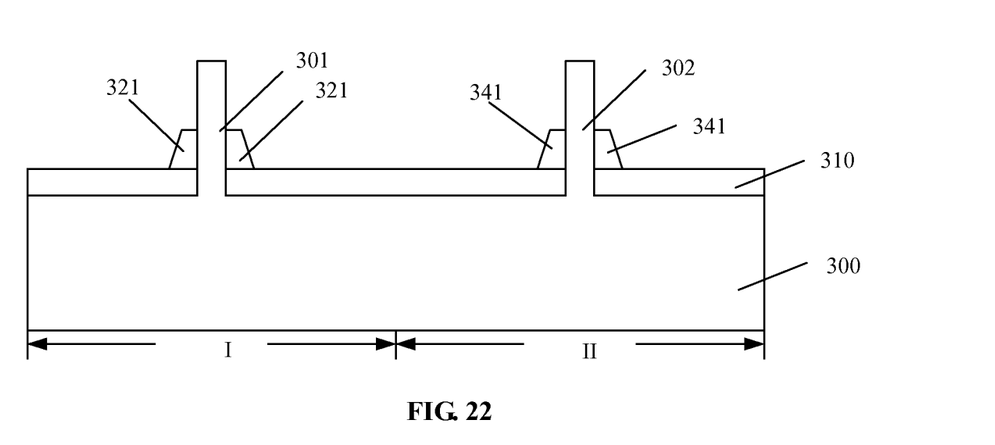

Referring to FIG. 22, the remaining first stress layer 320a (shown in FIG. 21) in the first region I, and the remaining second stress layer 340a (shown in FIG. 21) in the second region II are etched back to form a plurality of first lower stress spacers 321 on the lower portions of the first fin 301's opposite sidewalls, and to form a plurality of second lower stress spacers 341 on the lower portions of the second fin 302's opposite sidewalls. The first lower stress spacers 321 assert compressive stress to the n-type first fin 301. The second lower stress spacers 341 assert tensile stress to the p-type second fin 302. In this way, the carrier mobility in the fins may be suppressed. Because the first stress layer and the second stress layer are formed to be the same in material and thickness, although opposite in stress type, the lower stress spacers for the first fin 301 and the second fin 302 are able to be formed by one etching process simultaneously, resulting in a simple process.

Figure 23:
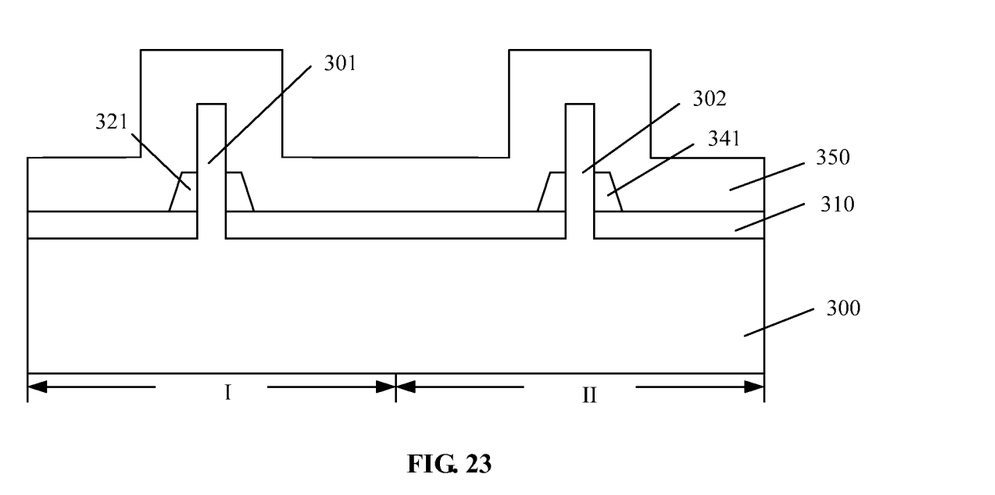

Referring to FIG. 23, a third stress layer 350 is formed over the first fin 301 and second fin 302. The third stress layer 350 is used to form upper stress spacers to increase the carrier mobility in the first fin 301's upper portion. Because the first fin 301 is n-type, the third stress layer 350 assert tensile stress.

The third stress layer 350 may be silicon nitride, silicon-oxy-nitride, or other ceramic materials and may be formed by a deposition process, the stress type and magnitude of which are controllable, as described above.

Figure 24:
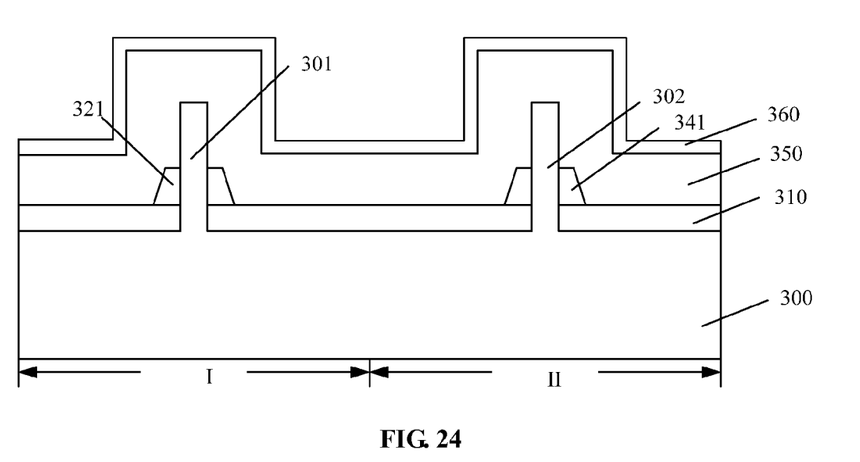

Referring to FIG. 24, a second etching stop layer 360 is formed on the third stress layer 350. The second etching stop layer 360 is used to protect the third stress layer 350 from being damaged by over-etching during a subsequent etching process. The second etch stop layer 360 may be made of silicon oxide.

Figure 25:
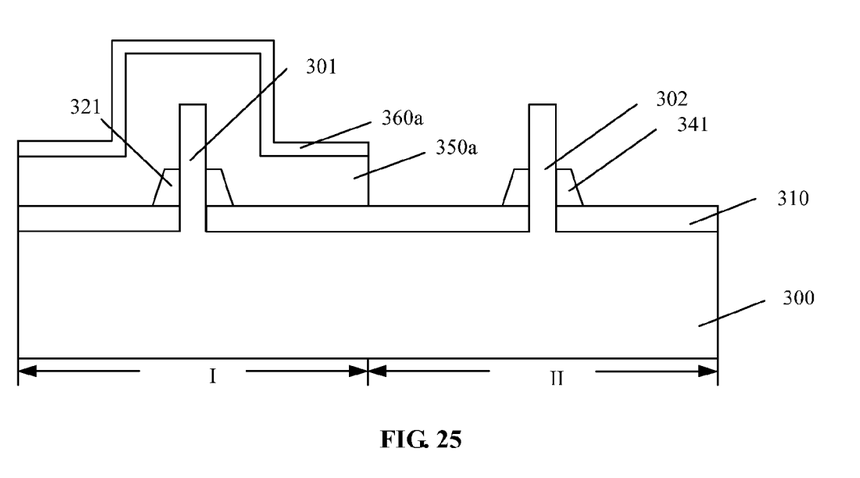

Referring to FIG. 25, the third stress layer 350 (shown in FIG. 24) and the second etching stop layer 360 (shown in FIG. 24) are partially removed, a remaining third stress layer 350a and a remaining second etching stop layer 360a remain in the first region I.

Figure 26:
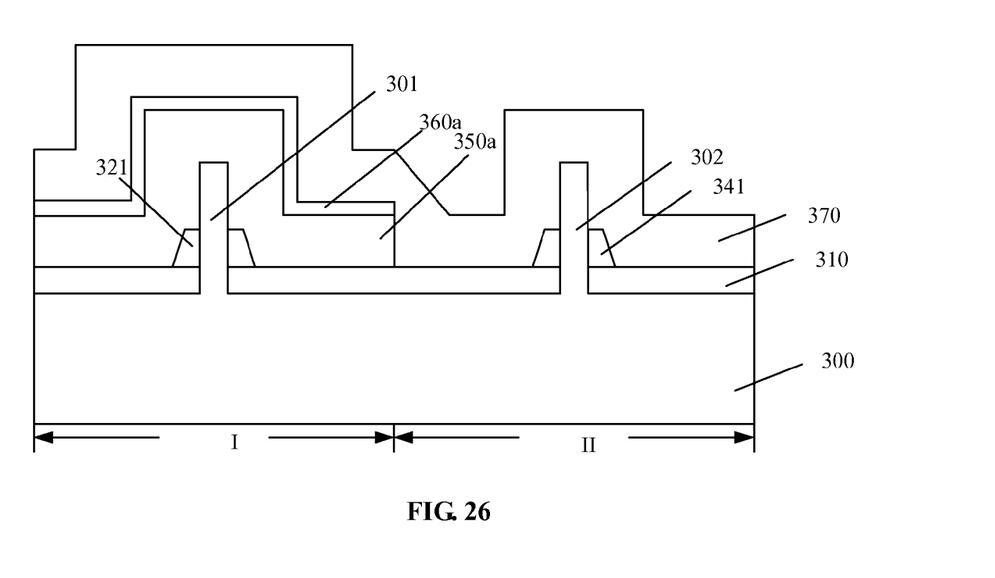

Referring to FIG. 26, a fourth stress layer 370 is formed, covering the second fin 302 and the remaining second etching stop layer 360a. The fourth stress layer 370 is used to form upper stress spacers in subsequent steps to increase the carrier mobility in the second fin 302's upper portion.

The fourth stress layer 370 may be made of silicon nitride, silicon-oxy-nitride, or other ceramic materials and may be formed by a deposition process. As an example, the second fin 302 is p-type, so the fourth stress layer 370 asserts compressive stress.

Figure 27:
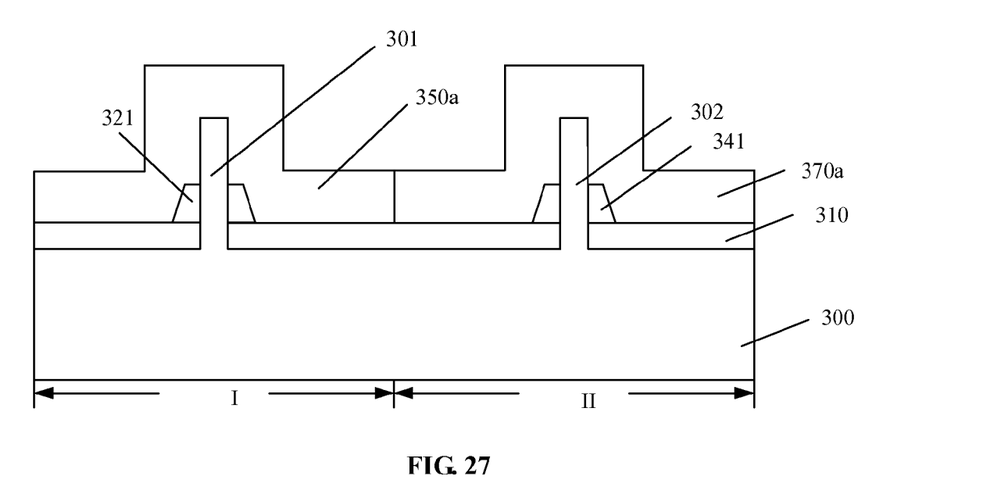

Referring to FIG. 27, a portion of the fourth stress layer 370 (shown in FIG. 26) in the first region I and the remaining second etching stop layer 360a (shown in FIG. 26) are removed by wet etching or dry etching. Therefore, the remaining third stress layer 350a and the remaining fourth stress layer 370a are respectively disposed only in the first region I and the second region II.

Figure 28:
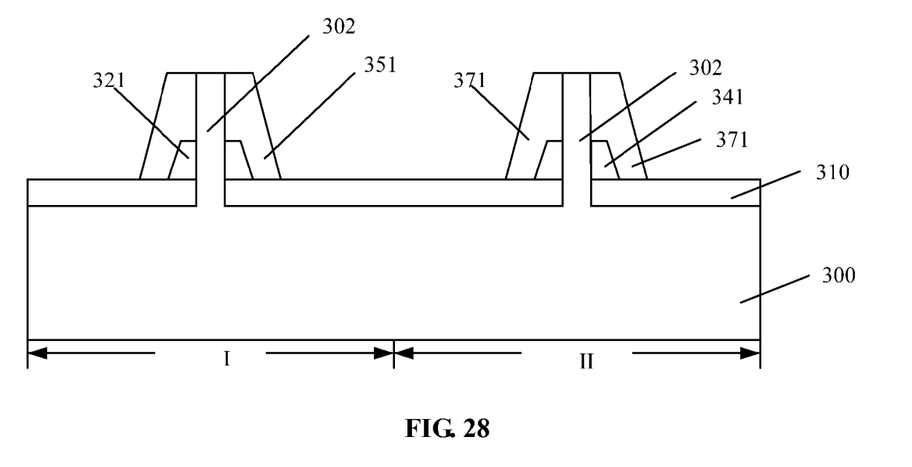

Referring to FIG. 28, the remaining third stress layer 350a (shown in FIG. 27) in the first region I, and the remaining fourth stress layer 370a (shown in FIG. 27) in the second region II are etched back to form a plurality of first upper stress spacers 351 over the first lower stress spacers 321 and the upper portions of the first fin 301, and to form a plurality of second upper stress spacers 371 over the second lower stress spacers 341 and the upper portions of the second fin 302. The first upper stress spacers 351 assert tensile stress to the n-type first fin 301. The second upper stress spacers 371 assert compressive stress to the p-type second fin 302. Thus, the carrier mobility in the fin channels may be increased. Similar to the lower stress spacers, the upper stress spacers in region I and region II can be formed in one etching process simultaneously.

To form a complete CMOS device, a gate structure and S/D regions are to be formed subsequently, which will not be illustrated herein.

The disclosure is illustrated, but not limited, by the preferred embodiments as above. Based on the disclosure, those skilled in the art can make any variation and modification without departing from the scope of the disclosure. Therefore, any such modification, variation and polishing based on the embodiments described herein is within the scope of the present disclosure.

What is claimed is:

1. A Fin FET structure, comprising:
   a substrate;
   a fin, formed on a top surface of the substrate, having a top surface and sidewalls and being doped;
   an isolating layer, disposed over the substrate and around the fin;
   a plurality of first-type stress spacers, contacting on lower portions of the fin's sidewalls and contacting on first top surface portions of the isolating layer;
   a plurality of second-type stress spacers, each contacting on a top surface and a sidewall surface of each first-type stress spacer, and contacting on an upper portion of the fin's sidewalls, and also contacting on a second top surface portion of the isolating layer, wherein the first-type stress spacers and the second-type stress spacers assert stress of opposite stress types, and each second-type stress spacer has a top surface coplanar with the top surface of the fin; and a gate structure disposed stretching over each fin covering a length portion of each fin's top surface and also covering each second-type stress spacer, wherein the gate structure comprises a gate electrode on a gate dielectric layer, the gate dielectric layer contacting on each second-type stress spacer.

2. The Fin FET structure according to claim 1, wherein a height of the first-type stress spacers ranges from about 1/3 to about 1/2 of the fin's height.

3. The Fin FET structure according to claim 1, wherein the first-type stress spacers have a height ranging from about 50 nm to about 200 nm.

4. The Fin FET structure according to claim 1, wherein the second-type stress spacers have a height ranging from about 200 nm to about 500 nm.

5. The Fin FET structure according to claim 1, wherein each of the first-type stress spacers and the second-type stress spacers comprises silicon nitride or silicon-oxy-nitride.

6. The Fin FET structure according to claim 1, wherein the fin is an n-type doped fin in an NMOS device, the first-type stress spacers assert a compressive stress to suppress carrier mobility in the lower portions of the Fin's sidewalls, and the second-type stress spacers assert a tensile stress.

7. The Fin FET structure according to claim 6, wherein the tensile stress ranges from about 0.8 GPa to about 2.0 GPa, and the compressive stress ranges from about 1.0 GPa to about 4.0 GPa.

8. The Fin FET structure according to claim 1, wherein the fin is a p-type doped fin, the first-type stress spacers assert a tensile stress, and the second-type stress spacers assert a compressive stress.

9. The Fin FET structure according to claim 8, wherein the tensile stress ranges from about 0.8 GPa to about 2.0 GPa, and the compressive stress ranges from about 1.0 GPa to about 4.0 GPa.

10. The Fin FET structure according to claim 1, further comprising a source region and a drain region formed in the fin on opposite sides of the gate structure.

11. The Fin FET structure according to claim 1, wherein the fin is a p-type doped fin in a PMOS device, the first-type stress spacers assert a tensile stress to suppress carrier mobility in the lower portions of the Fin's sidewalls, and the second-type stress spacers assert a compressive stress.

* * * * *